United States Patent
Jones et al.

(10) Patent No.: US 11,749,769 B2
(45) Date of Patent: Sep. 5, 2023

(54) LIGHT REDIRECTING FILM

(71) Applicant: 3M INNOVATIVE PROPERTIES COMPANY, St. Paul, MN (US)

(72) Inventors: Vivian W. Jones, Woodbury, MN (US); Gary E. Gaides, Woodbury, MN (US); Stephen A. Johnson, Woodbury, MN (US); Nathaniel I. Lehn, White Bear Lake, MN (US); Jiaying Ma, Cottage Grove, MN (US); Adam T. Ringberg, St. Paul, MN (US); Tianyu Wu, St. Paul, MN (US); Fuming B. Li, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 17/780,342

(22) PCT Filed: Dec. 9, 2020

(86) PCT No.: PCT/IB2020/061704
§ 371 (c)(1),
(2) Date: May 26, 2022

(87) PCT Pub. No.: WO2021/124026
PCT Pub. Date: Jun. 24, 2021

(65) Prior Publication Data
US 2023/0006085 A1 Jan. 5, 2023

Related U.S. Application Data

(60) Provisional application No. 62/950,261, filed on Dec. 19, 2019.

(51) Int. Cl.
*H01L 31/054* (2014.01)
*G02B 5/02* (2006.01)

(52) U.S. Cl.
CPC ........ *H01L 31/0547* (2014.12); *G02B 5/0231* (2013.01)

(58) Field of Classification Search
None
See application file for complete search history.

(56) References Cited

U.S. PATENT DOCUMENTS

| 4,505,967 A * | 3/1985 | Bailey | G02B 5/128 |
| | | | 428/164 |
| 6,626,545 B2 * | 9/2003 | Gardner | G02B 1/14 |
| | | | 359/850 |

(Continued)

FOREIGN PATENT DOCUMENTS

JP 2018-046112 3/2018

OTHER PUBLICATIONS

International Search Report for PCT International Application No. PCT/IB2020/061704, dated Dec. 19, 2019, 3 pages.

*Primary Examiner* — Derek S. Chapel
(74) *Attorney, Agent, or Firm* — Clifton F. Richardson

(57) ABSTRACT

A light redirecting film includes a first layer disposed on a second layer with structured major surfaces of the first and second layers facing each other. An optically reflective layer or a metal layer is disposed between the first and second layers. The first layer can be a hot melt adhesive layer and the second layer can be a polymeric layer. The first and second layers can be unitary layers. The first layer can be a first polymeric layer having a softening temperature T1 and the second layer can be a second polymeric layer having a softening temperature T2 greater than T1. Heating and/or applying pressure to the film changes an optical characteristic of the film by less than about 5%.

15 Claims, 10 Drawing Sheets

(56) References Cited

U.S. PATENT DOCUMENTS

| | | | |
|---|---|---|---|
| 9,972,734 B2* | 5/2018 | Chen | H01L 31/0547 |
| 2007/0092733 A1* | 4/2007 | Yang | C09J 133/14 |
| | | | 525/523 |
| 2010/0277801 A1 | 11/2010 | Nakajima | |
| 2011/0199685 A1 | 8/2011 | Ito | |
| 2015/0316693 A1* | 11/2015 | Sherman | G02B 5/128 |
| | | | 362/611 |
| 2019/0237603 A1 | 8/2019 | O'Neill et al. | |

* cited by examiner

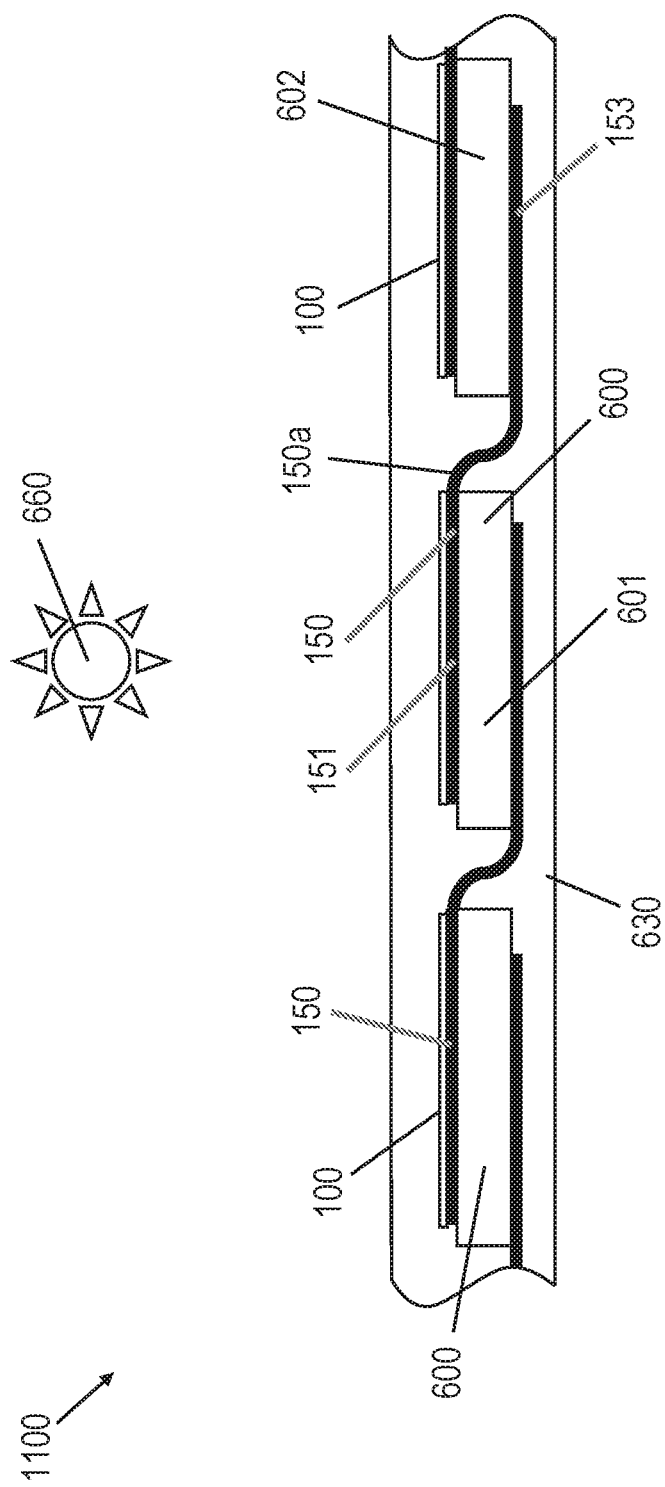

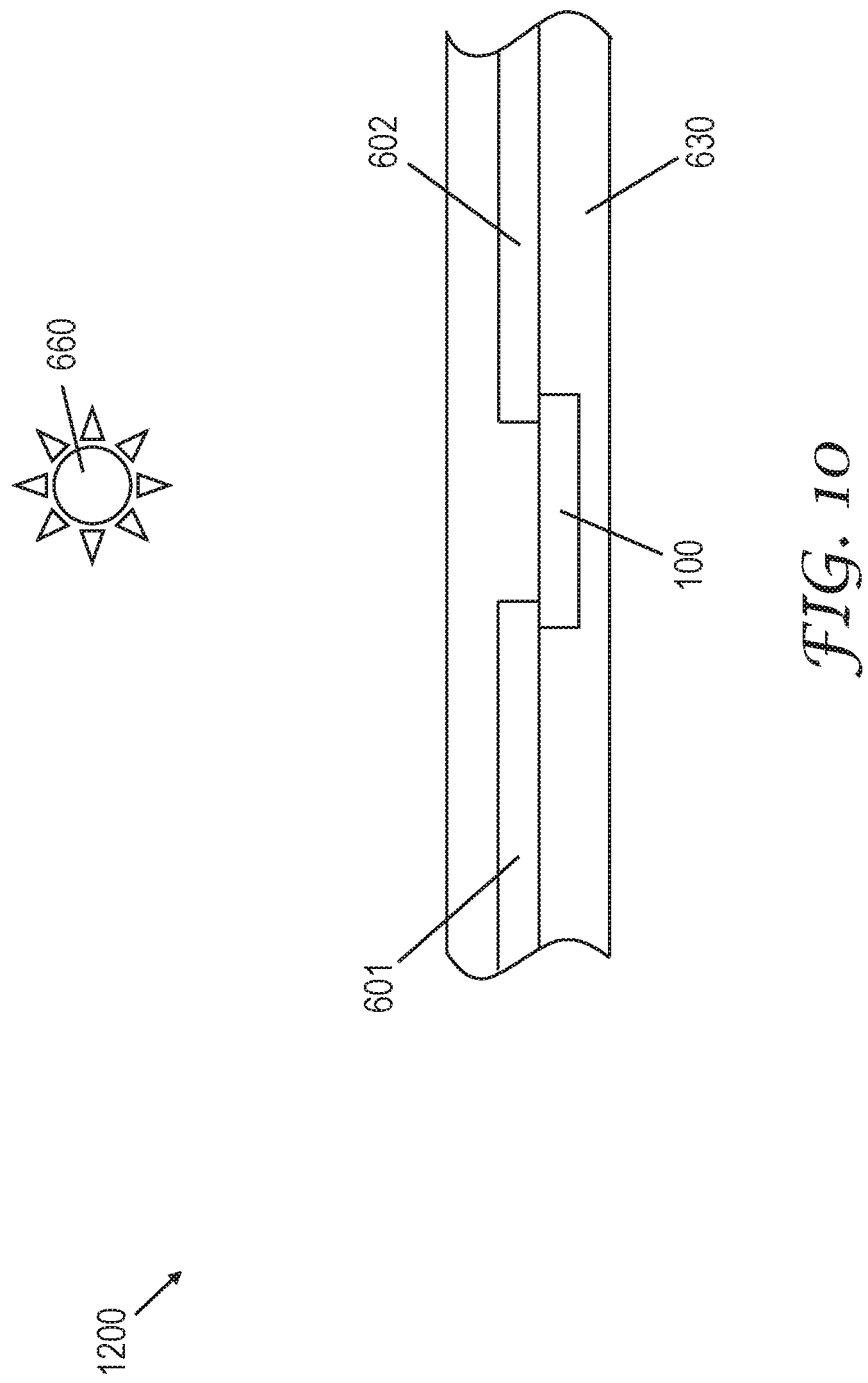

LIGHT REDIRECTING FILM

CROSS REFERENCE TO RELATED APPLICATIONS

This application is a national stage filing under 35 U.S.C. 371 of PCT/IB2020/061704, filed Dec. 9, 2020, which claims the benefit of Provisional Application No. 62/950,261, filed Dec. 19, 2019, the disclosures of which are incorporated by reference in their entirety herein.

BACKGROUND

Photovoltaic cells can be arranged in a row and electrically connected in series using tabbing ribbons. Light redirecting films can be applied over the tabbing ribbons.

SUMMARY

The present description relates to light redirecting films. The light redirecting films can be used in assemblies of photovoltaic cells (e.g., solar cells). In some embodiments, a light redirecting film includes a first layer disposed on a second layer with structured major surfaces of the first and second layers facing each other. In some embodiments, an optically reflective layer and/or a metal layer is disposed between the first and second layers. The first layer can be an adhesive layer, such as a hot melt adhesive layer, and the second layer can be a polymeric layer. The first layer can be a unitary layer (e.g., a unitary hot melt adhesive layer). The second layer can be a unitary layer (e.g., a unitary polymeric layer). The optically reflective layer and/or metal layer can be a unitary layer. The first layer can be a first polymeric layer having a softening temperature T1 and the second layer can be a second polymeric layer having a softening temperature T2 greater than T1. In some embodiments, heating and/or applying pressure to the film changes an optical characteristic (e.g., diffuse reflectance or surface roughness or included prism angle) of the film by less than about 5%. These and other aspects will be apparent from the following detailed description. In no event, however, should this brief summary be construed to limit the claimable subject matter.

BRIEF DESCRIPTION OF THE DRAWINGS

FIGS. 8-10 are schematic cross-sectional views of photovoltaic assemblies.

DETAILED DESCRIPTION

Figure 1:
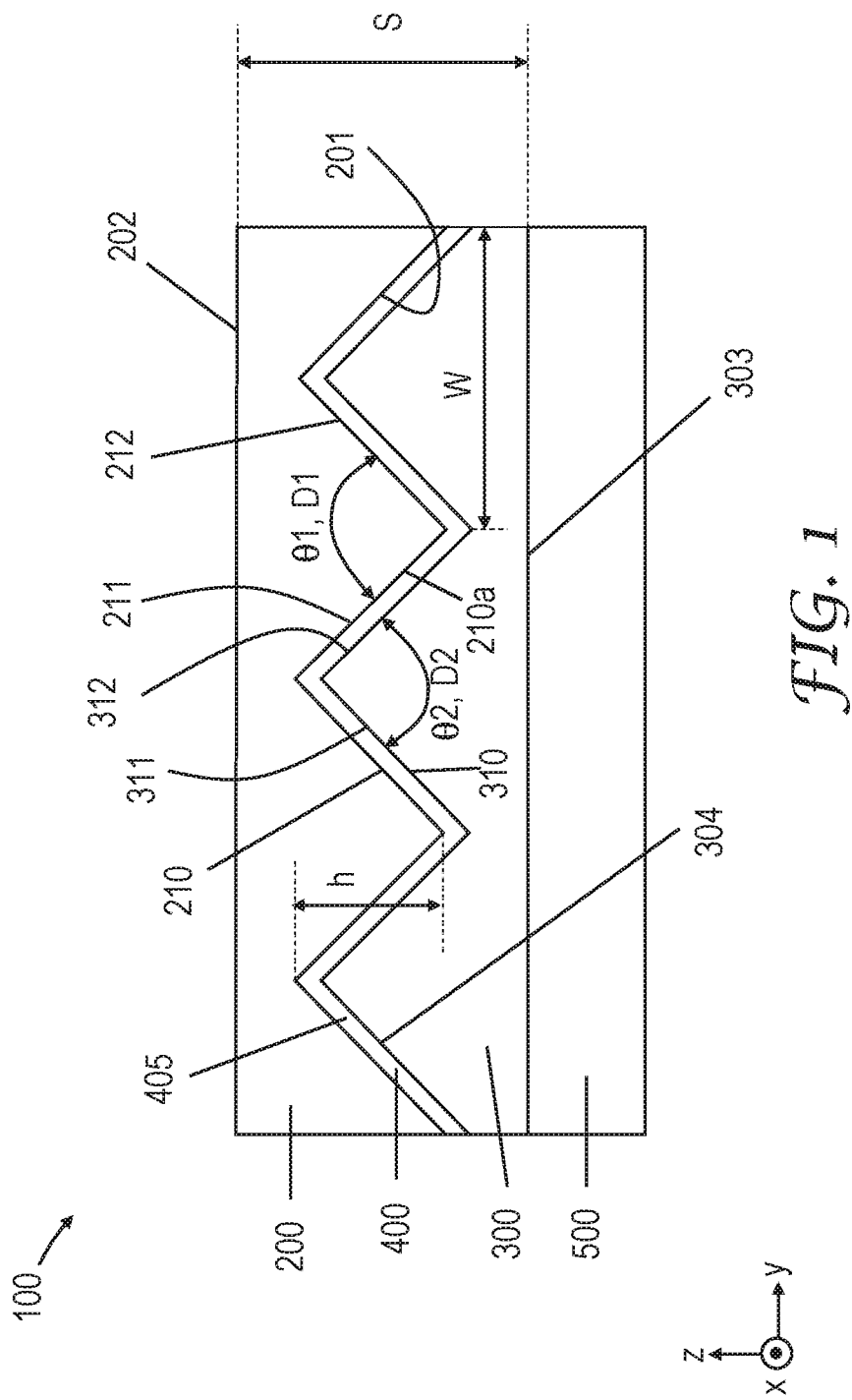
FIG. 1 is a schematic cross-sectional view of a light redirecting film according to some embodiments.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Light redirecting films (LRFs), such as those described in U.S. Pat. No. 9,972,734 (Chen et al.), can be laminated onto the conducting tabbing ribbons (e.g., zinc plated copper tabbing ribbons) of (e.g., silicon) photovoltaic cells (e.g., solar cells), for example. The film can redirect/reflect light rays that would otherwise be absorbed or scattered by the tabbing ribbons to increase the captured power of the cell (e.g., by about 2%). Such films have typically included aluminum coated, 120 degree microreplicated prisms formed on a polyethylene terephthalate (PET) substrate with an adhesive on the PET substrate opposite the prisms for attaching the film to the tabbing ribbons. One of the downsides with traditional LRF film is that it exacerbates the problem of cell fracture/cracking upon thermal cycling since the presence of tabbing ribbons can cause stress on the photovoltaic cell and the LRF disposed on the tabbing on the tabbing ribbons can increase the stress. This problem can be addressed by increasing the thickness of the encapsulating material (typically ethylene-vinyl acetate) to counteract the stress. Attaching the LRF to the tabbing ribbons serves to further increase the stress, and so the thickness of the encapsulating material would need to be further increased to counteract the stress. The need to increase the thickness of the encapsulating material is a problem for traditional LRFs since the industry is driving towards thinner and thinner solar cells to minimize material costs.

According to some embodiments of the present description, a thin (e.g., less than about 55 micrometers thick, not including any carrier layer or release layer that may be present) LRF is provided. The thin LRF can include an adhesive layer (e.g., a hot melt adhesive layer) disposed on a polymeric layer with an optically reflective (e.g., metal) layer disposed therebetween. In some embodiments, the LRF is mechanically stable (e.g., even though the LRF can be thin). For example, in some embodiments, bonding the LRF to a predetermined surface (e.g., a surface of a tabbing ribbon) by applying the adhesive layer to the predetermined surface and raising a temperature (e.g., to at least a bonding temperature and/or to at least a softening temperature of the adhesive layer) of at least portion(s) of the adhesive layer, and/or applying a pressure (e.g., of at least about 1 atmosphere or at least about 100 kPa) to at least portion(s) of the light redirecting film, changes an optical characteristic (e.g., diffuse reflectance or surface roughness or included prism angle) of the optically reflective layer by less than about 5%.

FIG. 1 is a schematic cross-sectional view of a light redirecting film, according to some embodiments, including layers 200, 300, 400 and optionally layer 500. In some embodiments, layer 200 is an adhesive layer, such as a hot melt adhesive layer, and layer 300 is a polymeric layer. In some embodiments, layers 200 and 300 are each polymeric layers (e.g., a first polymeric layer and a second polymeric layer, respectively) where layer 200 has a lower softening temperature than layer 300. Layer 200 and/or layer 300 and/or layer 400 can be a unitary layer. Layer 200 has a structured major surface 201 and an opposite major surface 202 which is substantially planar in some embodiments. Layer 300 has a substantially planar major surface 303 and an opposite structured major surface 304. A surface can be described as substantially planar if the surface is planar, or nominally planar (planar up to minor surface variations that would occur in normal manufacturing processes, for example), or planar up to minor surface variations that are small or negligible compared to those provided by the structures of the opposing structured major surface. Suitable materials for the layer 200 include the hot melt adhesives and other adhesives described elsewhere herein. Suitable materials for the layer 300 include thermoplastic olefin (TPO) polymers and copolymers (including, for example, linear low-density polyethylene (LLDPE) or high-density polyethylene (HDPE)), fluoropolymers (e.g., polyvinylidene fluoride (PVDF)) or fluoropolymer blends, cyclic olefin copolymers, or blends thereof, for example. Such polymers have refractive indices similar to encapsulants used in solar cell applications and are photochemically stable to wavelengths experienced in solar cell applications. Other suitable materials for layer 300 include polycarbonate, (co)polyester (polyester or copolyester), or combinations thereof, optionally blended with one or more other polymers or copolymers described elsewhere for layer 300 to lower the refractive index, for example. Suitable TPO resins include TPX Grade DX310, a 4-methylpentene-1-based olefin copolymer (also known as polymethylpentene) available from Mitsui Chemicals America, Inc. (Rye Brook, N.Y. 10573 USA), and HD6719, a high density polyethylene copolymer available from Exxon Mobil Chemical (Baytown, Tex. 77520 USA).

Layer 400 is disposed between the structured major surfaces 201 and 304. Layer 400 can be one or more an optically reflective layer, a metal layer, or a dielectric reflector. In some embodiments, layer 400 is an optically reflective layer. In some embodiments, the optically reflective layer is electrically conductive. In some embodiments, the optically reflective layer is or incudes a metal layer. The metal layer can include one or more of silver, gold and aluminum. For example, the metal layer can be an aluminum layer.

Layer 500 can be a carrier layer and/or a release layer and can be present prior to bonding the light redirecting film to a surface and then can be subsequently removed. Layer 500, when included, can be formed from any polymer that provides a desired peel force with layer 300. For example, the material for layer 500 can be selected to be a polymer that is incompatible with the material of layer 300 so that the layer 500 can readily separate from the layer 300. In some embodiments, layer 500 is or includes polycarbonate or (co)polyester based resins. Suitable materials for layer 500 include MARKROLON 2407, a polycarbonate available from Covestro North America (Pittsburgh, Pa. 15205 USA), and EASTAR GN071 is a copolyester available from Eastman Chemical Company (Kingsport, Tenn. 37660 USA).

Structured major surfaces 201 and 304 include structures 210 and 310, respectively. The structures 210 and/or 310 can be arrays of structures and/or can be (e.g., linear) microstructures extending in a first direction (x-direction) and arranged along an orthogonal second direction (y-direction). For example, the microstructures can be linear prisms. As another example, the microstructures can extend primarily along a first axis but can have a lateral displacement from the first axis that can vary along the length of the microstructures such that the microstructures have a "wavy" shape as described in U.S. Pat. Appl. Pub. No. 2018/0040757 (O'Neill et al.). Such "wavy" microstructures can be described as extending along a first direction and can be arranged along an orthogonal second direction such that the microstructures are substantially parallel. A microstructure can have at least two orthogonal dimensions (e.g., a height, h, and a width, W) that are each greater than about 10 nm and less than about 1 mm. A microstructure can have a third dimension (e.g., the length L schematically illustrated in FIG. 2) greater than about 1 mm, for example. In some embodiments, the major surfaces 201 and 304 face and substantially conform to one another (e.g., nominally conform to one another or conform up to variations on a scale of about the thickness of layer 400 or smaller, for example).

Figure 2:
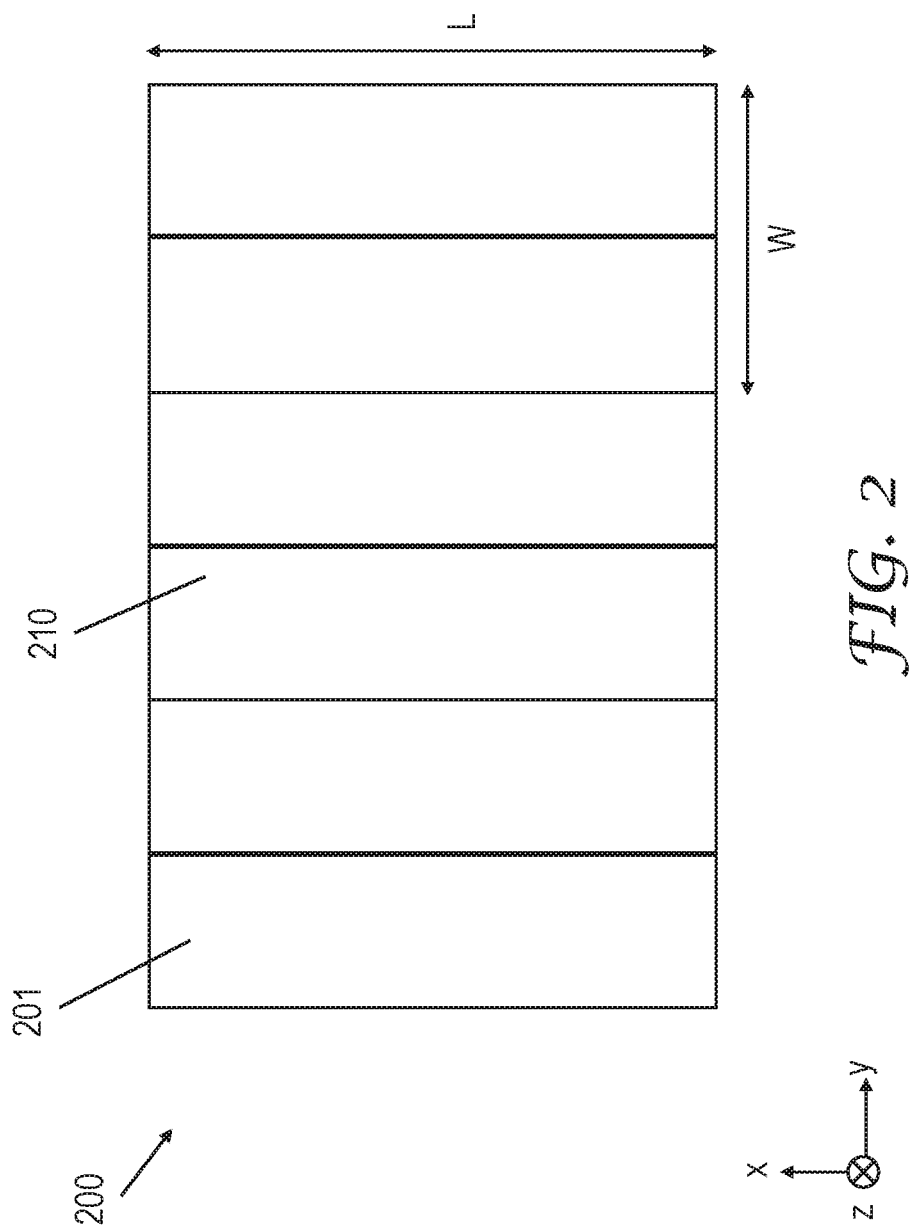
FIG. 2 is a schematic plan view of a structured major surface.

In some embodiments, the structures 210 are a plurality of substantially parallel microstructures (e.g., within 10 degrees or within 5 degrees of parallel). In some embodiments, each microstructure in the plurality of substantially parallel (e.g., linear) microstructures 210 includes opposing facets 211 and 212 defining a first included angle θ1 therebetween. In some embodiments, each microstructure in the plurality of substantially parallel microstructures 310 includes opposing facets 311 and 312 defining a second included angle θ2 therebetween. Average values D1 and D2 of the first and second included angles θ1 and θ2, respectively, are indicated. In some embodiments, each of the average values D1 and D2 are in a range of 110 degrees to 130 degrees. In some embodiments, one or both of the average values D1 and D2 is about 120 degrees. FIG. 2 is a schematic plan view of the structured major surface 201, according to some embodiments, schematically illustrating structures 210 extending in the first direction (x-direction) and arranged along the orthogonal second direction (y-direction). A schematic plan view of the structured major surface 304 may appear similarly.

In some embodiments, a light redirecting film 100 includes a hot melt adhesive layer 200 including a structured first major surface 201 opposite a (e.g., substantially planar) second major surface 202 where the structured first major surface 201 includes a plurality of substantially parallel linear microstructures 210 extending along a first direction (x-direction) and arranged along an orthogonal second direction (y-direction); a polymeric layer 300 disposed on the hot melt adhesive layer 200 and including a substantially planar third major surface 303 opposite a structured fourth major surface 304 where the structured first (201) and fourth (304) major surfaces face each other; and an optically reflective layer 400 disposed between, and conforming to, the structured first (201) and fourth (304) major surfaces. The hot melt adhesive layer 200, the polymeric layer 300 and the optically reflective layer 400 can be co-extensive or substantially co-extensive with each other. Layers can be described as substantially co-extensive with each other if at least about 60% of one layer is co-extensive with at least about 60% of the other layer. In some embodiments, for layers describes as substantially co-extensive, at least about 80% or at least about 90% of one layer is co-extensive with at least about 80% or at least about 90% of the other layer. In some embodiments, the structured first (201) and fourth (304) major surfaces conform to each other. In some embodiments, the (e.g., substantially planar) second (202) and third (303) major surfaces can be spaced apart (e.g., spacing S) by less than about 65 micrometers, or less than about 60 micrometers, or less than about 55 micrometers, or less than about 50 micrometers, or less than about 45 micrometers, or less than about 40 micrometers. In some embodiments, the spacing S is in a range of about 10 micrometers to about 55 micrometers, or about 15 micrometers to about 50 micrometers, or about 20 micrometers to about 45 micrometers, for example.

Figure 3:
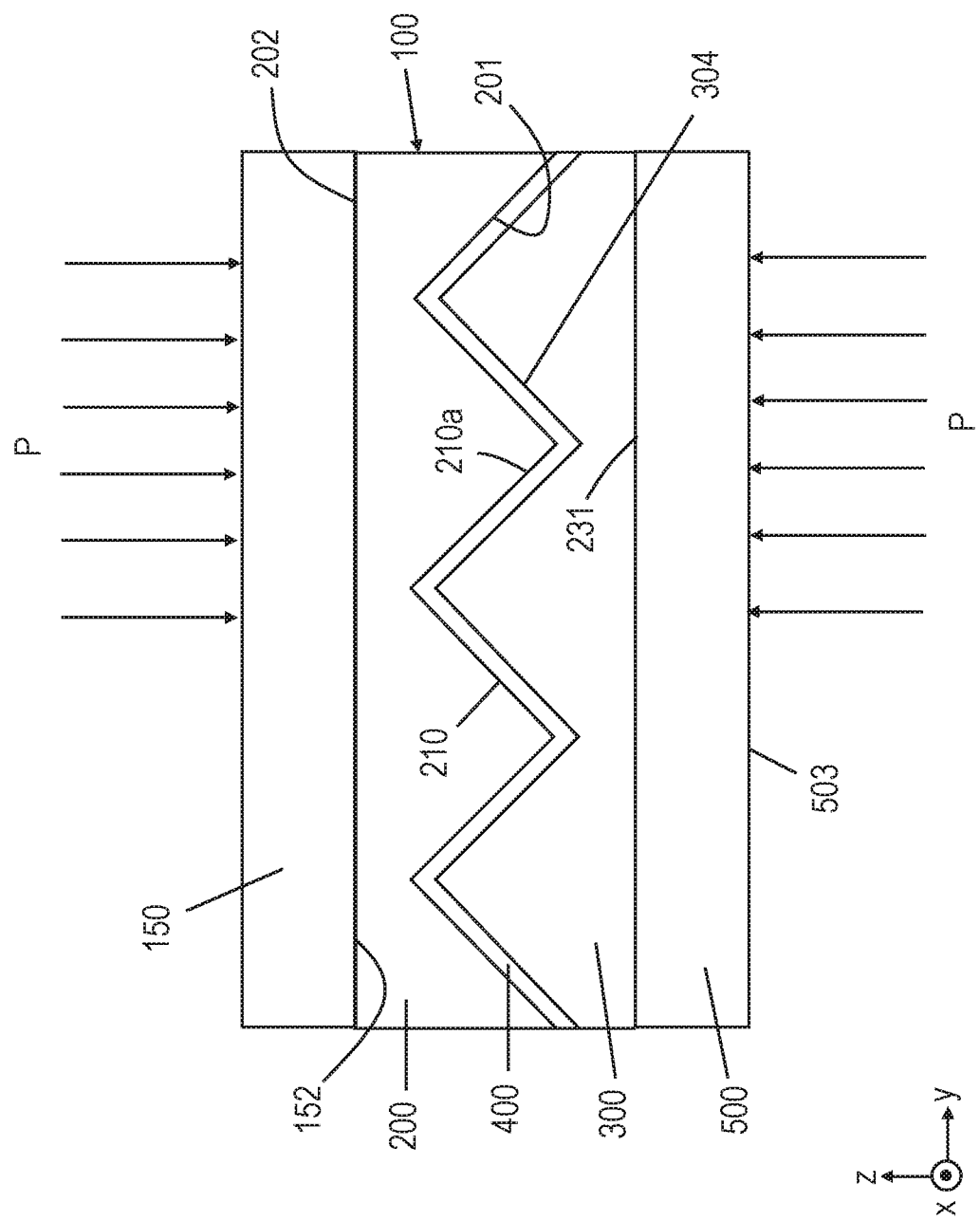
FIG. 3 is a schematic cross-sectional view of a light redirecting film bonded to a surface.

FIG. 3 is a schematic cross-sectional view of the light redirecting film 100 bonded to a surface 152 of a layer 150 which can be an electrically conductive tabbing ribbon (e.g., a flat copper wire), for example. In some embodiments, the structures 210 extend in a first direction (e.g., x-direction) and the layer 150 has a length along a length direction and a width along a width direction orthogonal to the length direction where the length is substantially larger than the width. The length direction can have any orientation relative to the first direction needed for a specified application. For example, the length direction can be substantially parallel to the first direction, or substantially perpendicular to the first direction, or at an angle of about 45 degrees to the first direction. In some embodiments, the light redirecting film 100 is such that bonding the light redirecting film 100 to a predetermined surface 152 by applying the second major surface 202 to the predetermined surface 152 and raising a temperature of at least portions (e.g., portions adjacent the surface 152) of the hot melt adhesive layer 200 to at least a bonding temperature (or a softening temperature, or another thermal transition temperature, or a temperature of at least about 50° C., or a temperature in a range of about 50° C. to about 120° C.) of the hot melt adhesive layer 200, changes an optical characteristic of the optically reflective layer 400 by less than about 5%. In some embodiments, the optical characteristic of the optically reflective layer 400 changes by less than about 3%, or less than about 2%.

The optical characteristic can be any characteristic of the optically reflective layer 400 relating to the optical performance of the layer. For example, the optical characteristic can be an optical property (e.g., average specular reflectance, average diffuse reflectance, average total (specular plus diffuse) reflectance) or a geometric property which affects an optical property (e.g., surface roughness, or included prism angle). In some embodiments, the optical characteristic of the optically reflective layer 400 is an average diffuse reflectance (see, e.g., FIG. 5) of the optically reflective layer 400. The average diffuse reflectance can be an average over an area of the reflective layer and an average over wavelengths in a range of about 450 nm to about 650 nm, or from about 350 nm to about 1100 nm, or from about 350 nm to about 1500 nm, for example. In some embodiments, the optical characteristic of the optically reflective layer 400 is an average surface roughness of the optically reflective layer 400 (see, e.g., FIG. 6). In some embodiments, the optical characteristic of the optically reflective layer 400 is the first included angle θ1, for example.

As will be appreciated by one of ordinary skill in the art, the bonding temperature of a hot melt adhesive is a temperature such that the hot melt adhesive substantially bonds to the predetermined surface 152 for temperatures at or above the bonding temperature but not for temperatures significantly lower than the bonding temperature. The bonding temperature can be associated with a thermal transition temperature of the hot melt adhesive (e.g., the bonding temperature can be the thermal transition temperature, or the bonding temperature can be somewhat (e.g., about 10° C. or about 20° C.) greater than the thermal transition temperature). The thermal transition temperature can be a glass transition temperature, a melting temperature, or a softening temperature, for example. In some embodiments, the bonding temperature is no less than the thermal transition temperature. For example, for crystalline or semi-crystalline hot melt adhesives, the bonding temperature can be the melting temperature or can be about 10° C. greater than the melting temperature. As another example, for amorphous hot melt adhesives that don't have a sharply defined melting point, the bonding temperature can be the softening temperature or can be about 10° C. greater than the softening temperature. In some embodiments, the bonding temperature is at least about 50° C., or is in a range of about 50° C. to about 120° C., for example.

The melting temperature can be determined according to D3418-15 "Standard Test Method for Transition Temperatures and Enthalpies of Fusion and Crystallization of Polymers by Differential Scanning calorimetry", for example. The softening temperature can be determined according to ASTM D693-11 "Standard Test Methods for Softening Point of Hydrocarbon Resins and Rosin Based Resins by Automated Ring-and-Ball Apparatus", or according to ASTM D1525-17e1 "Standard Test Method for Vicat Softening Temperature of Plastics", or according to ASTM D6090-17 "Standard Test Method for Softening Point Resins (Mettler Cup and Ball Method)", or according to ASTM E2347-16 "Standard Test Method for Indentation Softening Temperature by Thermomechanical Analysis", for example. The glass transition temperature can be determined according to ASTM D7426-08(2013) "Standard Test Method for Assignment of the DSC Procedure for Determining Tg of a Polymer or an Elastomeric Compound", for example.

Hot melt adhesives are thermoplastic materials that are typically solid and non-tacky at room temperature (e.g., 20° C.) but melt and flow upon heating. Hot melt adhesives are applied in the molten state and form a bond upon cooling to a solid state. Suitable hot melt adhesives include those that include ethylene-vinyl acetate (EVA) copolymer, polyolefin, metallocene polyolefin (e.g., metallocene polyethylene), polyamide, polyester, polyurethane, or styrene block copolymer, for example. These materials can be blended with tackifier(s). For example, an EVA-based hot melt adhesive can include EVA blended with terpene-phenol resin (TPR) tackifier. Suitable EVA-based hot melt adhesives are available from 3M Company, St. Paul, Minn. or from Dow Chemical Company, Midland, Mish., for example. Exemplary EVA-based hot melt adhesives include ELVAX 3180 and ELVAX 3175, both available from Dow Chemical Company. Suitable polyolefin-based adhesives include amorphous polyolefin hot melt adhesives, for example. Other suitable hot melt adhesives include copolymers of ethylene and methyl acrylate such as ELVALOY 1224 available from Dow Chemical Company.

In some embodiments, the hot melt adhesive layer is substantially cross-linked. The hot melt adhesive layer can be substantially cross-linked (e.g., cross-linked to at least the extent that a modulus (e.g., Young's modulus) increases by at least about 5%, for example) by electron-beam (e-beam) cross-linking, for example. After cross-linking, the adhesive layer is still a hot melt adhesive layer having a bonding temperature and/or a thermal transition temperature (e.g., a softening temperature and/or a melting temperature) that can be determined as described elsewhere. It has been found that crosslinking improves the adhesion force with a tabbing ribbon, for example, and can provide improved mechanical stability of the light redirecting film. The polymeric layer 300 can also, or alternatively, be substantially cross-linked to provide improved mechanical stability, for example.

In some embodiments, the hot melt adhesive is pressure sensitive such that when bonded at a temperature at or above the bonding temperature, the bond strength is improved by applying pressure during bonding. The pressure can be at least about 1 atmosphere (about 100 kPa), or at least about 2 atmospheres, or in a range of about 1 atmosphere to about 5 atmospheres, for example. The pressure will be understood to be relative to ambient atmospheric pressure so that applying a pressure of 1 atmosphere, for example, means that the applied pressure is 1 atmosphere above ambient pressure.

Figure 4:
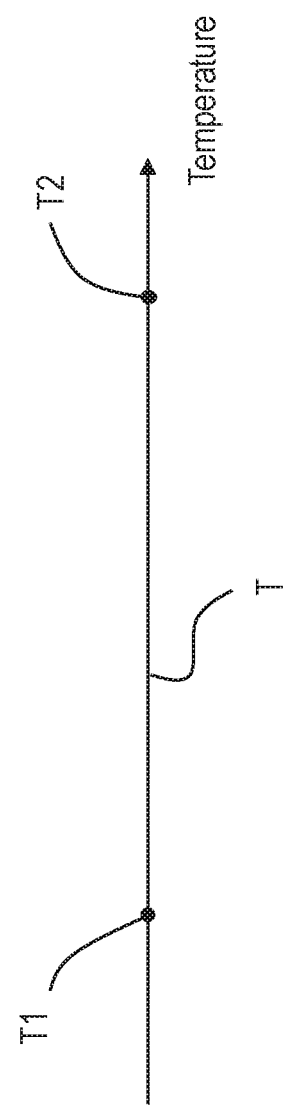
FIG. 4 is a schematic illustration of a temperature in a range of temperatures.

FIG. 4 is a schematic illustration of a temperature T. The light redirecting film 100 can be bonded to the surface 152 by raising a temperature of at least portions (e.g., the portion(s) that contact the surface 152, or at least a majority by area of the portion(s) that contact the surface 152) of the layer 200 and optionally also applying a pressure P to at least the portions. The temperature T can be greater than the temperature T1. The temperature T1 can be a melting temperature or a softening temperature of the layer 200, for example. The temperature T can be less than the temperature T2. The temperature T2 can be a softening temperature of the layer 300, for example. In some embodiments, T1<T<T2 and T is greater than about 30° C. or greater than about 50° C. Heat and/or pressure can be applied for a time of at least 10 minutes, for example, without changing the optical characteristic of the optically reflective layer by about 5% or more.

Optional layer 500 can be a carrier layer and/or a release layer, for example, or can optionally be omitted. In some embodiments, layer 500 is included to provide support for the layer 300 which, in some embodiments, is difficult to handle or process without the layer 500 due to the thinness of the layer. In some embodiments, the layers 300 and 500 are formed together by coextrusion, layer 400 is then deposited on the structured surface 304 (e.g., layer 400 can be an aluminum or other metal layer deposited by sputtering or evaporative deposition), layer 200 is then deposited onto layer 400. For example, layer 200 can be extruded onto layer 400 at a temperature above the softening temperature of the layer 200 and cast against a chill roll, which can have a flat or roughened surface. As another example, layer 200 can be formed by laminating a film adhesive to the surface of layer 400 by thermally embossing the film at a nip using layer 400 to form structures in film (e.g., using layer 400 as an "embossing roll"). A surface treatment (e.g., oxygen plasma treatment) can be applied to the structured surface 304 of the layer 300 prior to depositing the layer 400 to improve adhesion. After the layers 200 and 300 are formed, one or both of the layers may be cross-linked as described elsewhere. After the light redirecting film 100 is bonded to a surface 152, for example, the layer 500 can be removed.

In some embodiments, the light redirecting film 100 includes a carrier layer 500 disposed on and in contact with the substantially planar third major surface 303 of the polymeric layer 300, such that a bonding strength between the hot melt adhesive layer 200 and the optically reflective layer 400 is greater than a bonding strength between the carrier layer 500 and the polymeric layer 300. For example, the layer 500 can be removed from the layer 300 without substantially damaging the layer 400 since the bonding of the layer 400 to the layer 200 is substantially stronger than the bonding of the layer 300 to the layer 500, in some embodiments. In some embodiments, a bonding strength between the polymeric layer 300 and the optically reflective layer 400 is also greater than a bonding strength between the carrier layer 500 and the polymeric layer 300. In some embodiments, light redirecting film 100 includes a release layer 500 disposed on and in contact with the substantially planar third major surface 303 of the polymeric layer 300, such that when the light redirecting film 100 is bonded to the predetermined surface 152 by applying the second major surface 202 to the predetermined surface 152 and raising the temperature T of the at least portions of the hot melt adhesive layer 200 to at least the bonding temperature of the hot melt adhesive layer 200, removing the release layer 500 from the polymeric layer results in no, or very little, damage to the optically reflective layer 400. Damage to the optically reflective layer that causes a change in reflectivity of the layer by less than about 5%, or less than about 3% or less than about 2%, for example, can be described as very little damage.

In some embodiments, light redirecting film 100 includes a unitary hot melt adhesive layer 200 including a structured first major surface 201 opposite a substantially planar second major surface 202 where the structured first major surface 201 includes a regular array of first structures 210 and where at least one of the first structures 210a including opposing facets 211 and 212 defining a first included angle θ1 therebetween; a unitary polymeric layer 300 including a substantially planar third major surface 303 opposite a structured fourth major surface 304 facing, and substantially conforming to, the structured first major surface 201; and a metal layer 400 disposed between, and substantially co-extensive with, the structured first (201) and fourth (304) major surfaces. The (e.g., substantially planar) second (202) and third (303) major surfaces can be spaced apart (e.g., spacing S) by less than about 55 micrometers or by a spacing in a range described elsewhere herein. The light redirecting film 100 can be such that raising a temperature of the light redirecting film 100 to at least a bonding temperature (or a softening temperature, or another thermal transition temperature, or a temperature of at least about 50° C., or a temperature in a range of about 50° C. to about 120° C.) of the hot melt adhesive 200 while applying a pressure P of at least about 1 atmosphere (or at least about 100 kPa) to the light redirecting film 100 at least at a location 231 on the light redirecting film 100 corresponding to the at least one of the first structures 201a, changes the first included angle θ1 by less than about 5%. In some embodiments, the first include angle θ1 changes by less than about 3% or by less than about 2%.

In some embodiments, the light redirecting film 100 and the surface 152 can be substantially coextensive. In some embodiments, the light redirecting film 100 can extend beyond edges of the surface 152 (see, e.g., FIG. 8). The layer 500 has a major surface 503 opposite the layer 300. The pressure P can be applied over at least a portion of the major surfaces 202 and 503 (e.g., a majority of the major surfaces or a portion of the major surface 202 overlapping with the major surface 152 and a corresponding portion of the major surface 503) or over substantially entire areas of the major surfaces 202 and 503. If the layer 500 is not present, the pressure P can be applied over at least a portion of the major surfaces 202 and 303. In some embodiments, the layer 500 is present when the pressure P is applied and then the layer 500 is subsequently removed. In some embodiments, the applied pressure P is at least 2 atmospheres.

In some embodiments, the first structures 210 have an average height h of less than about 20 micrometers, or less than about 10 micrometers. In some embodiments, the first structures 210 have an average height h of greater than about 3 micrometers, or greater than about 5 micrometers. In some embodiments, the first structures 210 have an average height h between about 5 micrometers and about 20 micrometers, or between about 5 micrometers and about 10 micrometers, or between about 5 micrometers and about 7 micrometers. In some embodiments, the first structures 210 have an average height h of about 7 micrometers. The second structures 310 can have an average height in any of the ranges described for the first structures 210. In some embodiments, the unitary polymeric layer 300 is substantially cross-linked. In some embodiments, the unitary hot melt adhesive layer 200 is substantially cross-linked.

As described further elsewhere, in some embodiments, the light redirecting film 100 includes a carrier layer 500 disposed on and in contact with the substantially planar third major surface 303 of the unitary polymeric layer 300, such that a bonding strength between the unitary hot melt adhesive layer 200 and the metal layer 400 is greater than a bonding strength between the carrier layer 500 and the unitary polymeric layer 300. In some such embodiments or in other embodiments, a bonding strength between the unitary polymeric layer 300 and the metal layer 400 is greater than a bonding strength between the carrier layer 500 and the unitary polymeric layer 300. In some embodiments, the light redirecting film 100 includes a release layer 500 disposed on and in contact with the substantially planar third major surface 303 of the unitary polymeric layer 300, such that when the light redirecting film 100 is bonded to a predetermined surface 152 by applying the second major surface 202 to the predetermined surface 152 and raising the temperature of the at least portions of the unitary hot melt adhesive layer 200 to at least the bonding temperature of the unitary hot melt adhesive layer 200, removing the release layer 500 from the unitary polymeric layer 300 results in no, or very little, damage to the metal layer 400.

In some embodiments, a light redirecting film 100 includes a first polymeric layer 200 having a softening temperature T1 and a structured first major surface 201 including a regular array of first structures 210 where the first polymeric layer 200 is configured to bond to a predetermined surface 152 at a bonding temperature greater than T1; and a second polymeric layer 300 having a softening temperature T2 where T2>T1. The second polymeric layer 300 includes a structured second major surface 304 facing the structured first major surface 201 and including a regular array of second structures 310. Each first structure 210 includes a plurality of facets 211, 212 defining a first included angle θ1 therebetween. Each second structure includes a plurality of facets 311, 312 defining a second included angle θ2 therebetween. The structured first (201) and second (304) major surfaces define a space 405 therebetween (see, e.g., FIG. 1). The light redirecting film 100 can include a metal layer 400 substantially filling the space 405 (e.g., filling at least about 60%, or at least about 80%, or at least about 90% of the space 405, or filling all of the space 405 except possibly near edges of the film) between the structured first (201) and second (304) major surfaces. The light redirecting film 100 can be such that in a cross-section perpendicular to the light redirecting film 100 (e.g., the y-z cross-section), the first and second included angles have respective average values D1 and D2, and such that after heating the light redirecting film 100 at a temperature T between T1 and T2 for at least 10 minutes while applying a pressure P of at least about 1 atmosphere (or at least about 100 kPa) to the light redirecting film 100, each of D1 and D2 changes by less than about 5%, or less than about 3%, or less than about 2%. The temperature T can be greater than about 50° C., for example. In some embodiments, the first polymeric layer 200 and/or the second polymeric layer 300 is substantially cross-linked as described elsewhere herein.

In some embodiments, the softening temperature is greater than room temperature or greater than about 30° C., or greater than about 40° C., or greater than about 50° C., for example. In other embodiments, the softening temperature may be below room temperature and the layer 200 may be configured to cure at a temperature above room temperature (e.g., at the temperature T between T1 and T2). In some embodiments, the softening temperature T1 is in a range from 40° C. to about 120° C. or from about 50° C. to about 120° C. In some embodiments, the softening temperature T2 is at least about 20° C. or at least about 40° C. higher than the softening temperature T1. In some embodiments, the first polymeric layer 200 is a hot melt adhesive layer as described elsewhere herein. In some embodiments, the first polymeric layer 200 is or includes one or more of a hot melt adhesive, a heat activated adhesive, a pressure sensitive adhesive (e.g., for at least one temperature), a structural adhesive, or an optically clear adhesive. In some embodiments, the layer 200 is simultaneously more than one of a hot melt adhesive layer, a heat activated adhesive layer, a pressure sensitive adhesive layer, a structural adhesive, and an optically clear adhesive layer. Useful materials for the first polymeric layer 200 include the hot melt adhesives described elsewhere herein and adhesives described in U.S. Pat. No. 9,972,734 (Chen et al.), for example. An adhesive is a pressure sensitive adhesive when it is a pressure sensitive adhesive for at least one temperature. For example, an adhesive or a polymer layer may be a pressure sensitive adhesive at an elevated temperature (e.g., at about 50° C. or higher) but not at room temperature. Pressure sensitive adhesives possess certain properties at for the at least one temperature including the following: (1) aggressive and permanent tack, (2) adherence with no more than finger pressure, (3) sufficient ability to hold onto an adherend, and (4) sufficient cohesive strength to be removed cleanly from the adherend. Pressure sensitive adhesives are known in the art and are described in U.S. Pat. No. 9,972,734 (Chen et al.), for example. A pressure sensitive adhesive may be applied as precursors which are then cured (e.g., UV cured acrylates) to form a pressure sensitive adhesive layer. In some embodiments, the first polymer layer 200 is a pressure sensitive adhesive at a temperature above the softening temperature T1. In some such embodiments or in other embodiments, the first polymer layer 200 is not a pressure sensitive adhesive at a temperature below the softening temperature T1. For example, the Dahlquist criterion for a pressure sensitive adhesive that the shear modulus G' is less than 0.1 MPa may be satisfied at a temperature between T1 and T2, but not at a temperature below T1.

Heat activated adhesives are non-tacky at room temperature but become tacky and capable of bonding to a substrate at elevated temperatures. These adhesives usually have at least one of a softening point, a glass transition temperature, or a melting point above room temperature. Heat activated adhesives are known in the art and are described in U.S. Pat. No. 4,248,748 (McGrath et al.) and U.S. Pat. No. 6,753,379 (Kawate et al.), for example.

A structural adhesive is an adhesive which is configured to be cross-linked to provide structural strength (e.g., a bond strength greater than about 6 MPa). For example, a structural adhesive can be formed by coating precursors onto layer 400, and then drying and/or partially curing the coated layer to form a structural bonding layer. The structural bonding layer can be applied to a surface and then heated to cross-link the layer. The structural bonding layer can initially soften when heated and then subsequently harden as the layer is cross-linked. In some embodiments, the structural bonding layer is a heat activated layer that is non-tacky at room temperature and that becomes tacky at elevated temperature before cross-linking. In some embodiments, the structural bonding layer is a pressure sensitive adhesive when initially applied to the predetermined surface. Such adhesives are described in U.S. Pat. No. 5,721,289 (Karim et al.), for example. Suitable structural adhesives include hybrid adhesives, such as epoxy/acrylate hybrid adhesives, where at least one monomer or oligomer component is initially cured to form a structural bonding layer and at least one other monomer or oligomer component is subsequently cured after the structural bonding layer has been applied to a surface. For example, an epoxy/acrylate hybrid adhesive can be coated onto layer 400 and then can be ultraviolet (UV) cured to cure acrylate monomers to form a structural adhesive layer. The structural adhesive layer can then be applied to a surface and then heated to cure the epoxy monomers or oligomers. Suitable hybrid adhesives are described in U.S. Pat. Appl. Pub. Nos. 2003/0192638 (Yang et al.); 2007/0092733 (Yang et al.); and 2015/0165670 (Herbert et al.), for example.

An optically clear adhesive is an adhesive which is substantially optically clear. An optically clear adhesive layer can have an optical haze of less than about 5%, or less than about 3%, for example. An optically clear adhesive can have an average transmittance (e.g., over wavelengths from about 450 nm to about 650 nm) or a luminous transmittance of at least about 80% or at least about 90%, for example. The optical haze and luminous transmittance can be determined according to ASTM D1003-13 "Standard Test Method for Haze and Luminous Transmittance of Transparent Plastics", for example.

As described further elsewhere, in some embodiments, the light redirecting film 100 includes a carrier layer 500 disposed on and in contact with a substantially planar third major surface 303 of the second polymeric layer 300 opposite the structured second major surface 304, such that a bonding strength between the first polymeric layer 200 and the metal layer 400 is greater than a bonding strength between the carrier layer 500 and the second polymeric layer 300. In some such embodiments or in other embodiments, a bonding strength between the second polymeric layer 300 and the metal layer 400 is greater than the bonding strength between the carrier layer 500 and the second polymeric layer 300. In some embodiments, the light redirecting film 100 includes a release layer 500 disposed on and in contact with a substantially planar third major surface 303 of the second polymeric layer 300 opposite the structured second major surface 304, such that when the light redirecting film 100 is bonded to the predetermined surface 152 by applying a fourth major surface 202 of the first polymeric layer 200 opposite the structured first major surface 201 to the predetermined surface 152 and raising the temperature of the at least portions of the first polymeric layer 200 to the temperature between T1 and T2, removing the release layer 500 from the second polymeric layer 300 results in no, or very little, damage to the metal layer 400.

Figure 5:
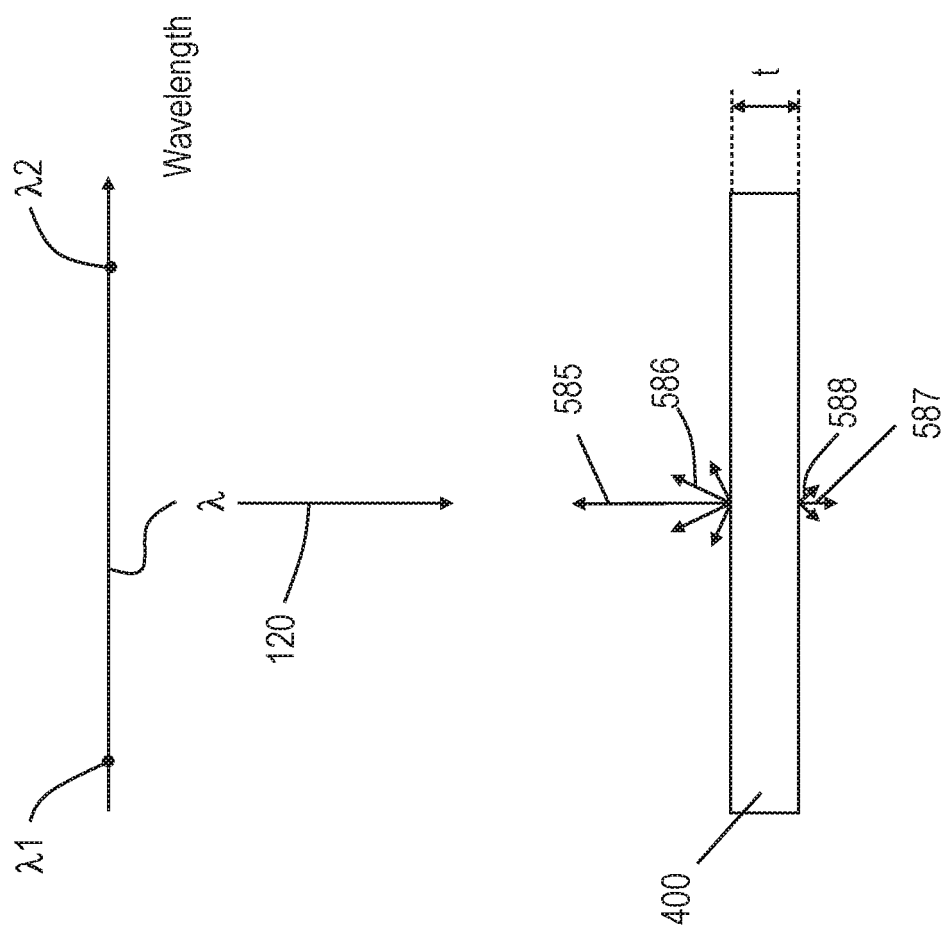
FIG. 5 is a schematic illustration of light incident on a portion of a layer.

FIG. 5 is a schematic cross-sectional view of a portion of layer 400 schematically illustrating a substantially normally incident light 120 and specularly reflected light 585, diffusely reflected light 586, specularly transmitted light 587 and diffusely transmitted light 588. The reflected light is the total of the specularly reflected light 585 and the diffusely reflected light 586. The incident light 120 can have wavelength(s) λ in a range of λ1 to λ2. In some embodiments, λ1 is about 450 nm and λ2 is about 650 nm. In some embodiments, λ1 is about 350 nm and λ2 is about 1100 nm or about 1500 nm. In some embodiments, for substantially normally incident light 120 and for at least one wavelength λ in a range from about 450 nm to about 650 nm, the optically reflective layer reflects at least 60%, or at least 70% of the incident light. In some embodiments, for substantially normally incident light 120 and for at least one wavelength λ in a range from about 350 nm to about 1100 nm, the optically reflective layer reflects at least 60%, or at least 70% of the incident light. In some embodiments, for substantially normally incident light 120 and for at least one wavelength λ in a range from about 350 nm to about 1500 nm, the optically reflective layer reflects at least 60%, or at least 70% of the incident light. In some embodiments, for substantially normally incident light 120, the optically reflective layer has an average reflectance of at least 60% in a wavelength range from about 450 nm to about 650 nm, or from about 350 nm to about 1100 nm, or from about 350 nm to about 1400 nm. The transmitted light is the total of the specularly transmitted light 587 and the diffusely transmitted light 588. In some embodiments, the transmitted light is small (e.g., transmission of less than about 5% or less than about 1%, or less than about 0.5% of the energy of the incident light 120). The total transmission can be characterized in terms of the optical density which is the base 10 logarithm of the intensity of light incident on the layer divided by the intensity of the transmitted light. In some embodiments, the layer 400, which can be a metal layer, for example, has an optical density of greater than about 1.5, or greater than about 2, for at least one wavelength in a range from about 450 nm to about 650 nm. In some embodiments, the layer 400 has an optical density of greater than about 1.5, or greater than about 2, for at least one wavelength in a range from about 350 nm to about 1100 nm. In some embodiments, the layer 400 has an optical density of greater than about 1.5, or greater than about 2, for at least one wavelength in a range from about 350 nm to about 1500 nm.

The average thickness of the layer 400 is t. In some embodiments, layer 400 is a metal layer having an average thickness t less than about 500 nm, or less than about 120 nm, or less than about 100 nm. In some such embodiments, or in other embodiments, the average thickness t is greater than about 20 nm, or greater than about 30 nm, or greater than about 40 nm. In some embodiments, the average thickness of the metal layer is between about 30 nm and about 120 nm.

Figure 6:
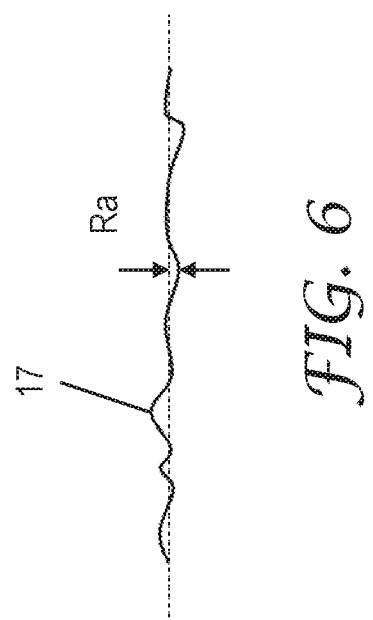
FIG. 6 is a schematic cross-sectional view of a surface.

In some embodiments, the layer 400 has a surface roughness that contributes to a diffuse reflectance. FIG. 6 is a schematic cross-sectional view of a surface 17 which can schematically represent a surface (e.g., the major surface facing layer 200 or the major surface facing layer 300) of the layer 400. The surface roughness can be a mean displacement surface roughness Ra.

Figure 7:
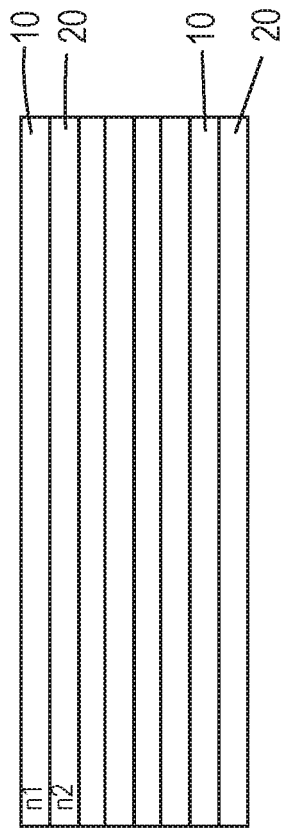
FIG. 7 is a schematic cross-sectional view of an optically reflective layer.

As an alternative to a metal layer, a dielectric reflector can be used as the optically reflective layer. Dielectric reflectors including alternating layers are known in the art. FIG. 7 is a schematic cross-sectional view of an optically reflective layer 400, according to some embodiments. In the illustrated embodiment, the optically reflective layer includes a plurality of alternating lower index first (10) and higher index second (20) layers. The refractive index of the first layers 10 is denoted n1 and the refractive index of the second layers 20 is denoted n2. Refractive indices are determined at 532 nm, unless indicated otherwise. In some embodiments, n2−n1 is at least about 0.05, or at least about 0.1. The alternating first and second layers can be deposited by vapor deposition or by any suitable thin-film deposition technique known in the art. One or both of the first and second layers can be inorganic or organic. In some embodiments, the lower index first layers 10 are organic polymeric layers and the higher index second layers 20 are inorganic layers.

The light redirecting film 100 (see, e.g., FIG. 1) can be used in a photovoltaic assembly to increase the efficiency of the assembly. Photovoltaic cells can be arranged in row(s), and/or column(s), and electrically connected using electrically conductive tabbing ribbon(s). The tabbing ribbons can absorb light or scatter light away from the photovoltaic cells. Covering the tabbing ribbons with a light redirecting film can redirect light that would otherwise be absorbed by, or scattered from, the tabbing ribbons. For example, the redirected light can reflect from an air interface with an outermost (e.g., glass) layer of the assembly of photovoltaic cells and then be subsequently absorbed by one of the photovoltaic cells.

Figure 8:
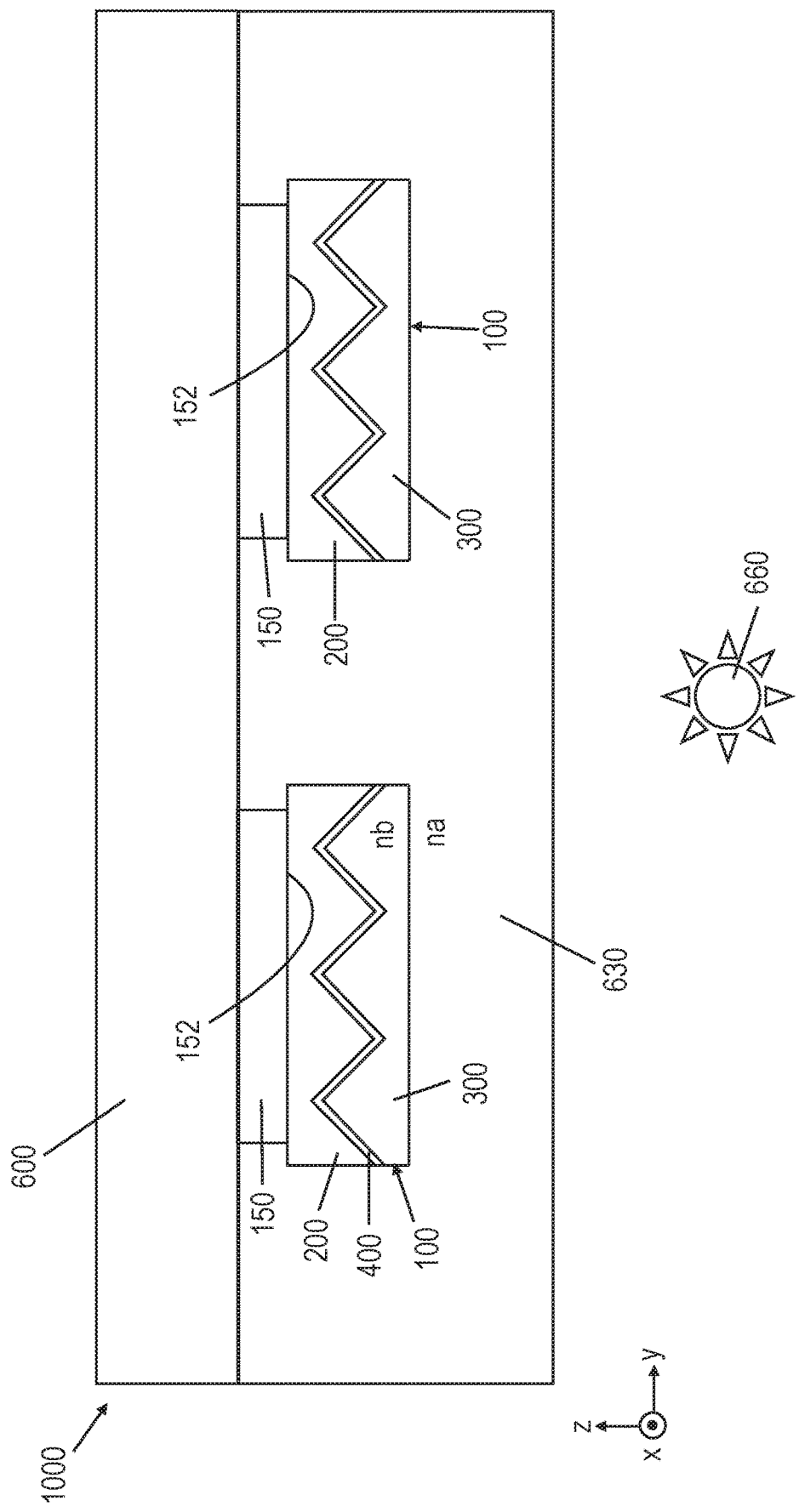

FIG. 8 is a schematic cross-sectional view of a photovoltaic assembly 1000 including at least one photovoltaic cell 600 (one photovoltaic cell is illustrated) and at least one electrically conductive tabbing ribbon 150 (two tabbing ribbons are illustrated) disposed on the at least one photovoltaic cell 600. The electrically conductive tabbing ribbon(s) can be used to electrically connect photovoltaic cells and/or for providing an electrical connection to the at least one photovoltaic cell. A photovoltaic assembly can be disposed to receive energy from a light source 660 (e.g., the sun) and can be used to generate electrical energy from the received energy. In some embodiments, for each photovoltaic cell 600, the at least one electrically conductive tabbing ribbon 150 includes a plurality of tabbing ribbons 150 disposed on the at least one photovoltaic cell 600. In FIG. 8, the photovoltaic assembly 1000 is shown oriented such that the light redirecting film 100 has the same orientation as shown in FIG. 1. The light redirecting film 100 can be oriented such that layer 300 faces the light source 660 and the layer 200 faces the photovoltaic cell 600.

In some embodiments, for each tabbing ribbon 150, a light redirecting film 100 is disposed on the tabbing ribbon 150 such that the layer 200 (e.g., first polymeric layer or (e.g., unitary) hot melt adhesive layer) bonds the light redirecting film 100 to the tabbing ribbon 150.

In some embodiments, an encapsulant 630 is disposed over at least a portion of each light redirecting film 100 and over at least a portion of the at least one photovoltaic cell 600. The encapsulant 630 can be disposed on one side of the at least one photovoltaic cell 600, or the encapsulant 630 can fully encapsulate the at least one photovoltaic cell 600, for example. The layer 300 and the encapsulant 630 can have approximately equal refractive indices. This can reduce Fresnel reflections at an interface between layer 300 and encapsulant 630. In some embodiments, the encapsulant 630 has a refractive index of na, the polymeric layer 300 has a refractive index of nb, and |na−nb|<0.05. In some embodiments, |na−nb| is less than about 0.03 or less than about 0.02. Refractive indices can be determined using ASTM D542-14 "Standard Test Method for Index of Refraction of Transparent Organic Plastics".

FIG. 9 is a schematic cross-sectional view of a photovoltaic assembly 1100 including at least one photovoltaic cell 600 (three photovoltaic cells are shown) and at least one electrically conductive tabbing ribbon 150 (portions of four tabbing ribbons are shown) disposed on the at least one photovoltaic cell 600. In some embodiments, the at least one photovoltaic cell 600 includes spaced apart first (601) and second (602) photovoltaic cells, and the at least one electrically conductive tabbing ribbon 150 includes at least one first tabbing ribbon 150a having a first end portion 151 disposed on a top surface of the first photovoltaic cell 601 and a second end portion 153 disposed on a bottom surface of the second photovoltaic cell 602. The light redirecting layer 100 in the photovoltaic assembly 1100 of FIG. 9 can be oriented such that the layer 300 faces the light source 660 and the layer 200 faces the photovoltaic cell 600.

In some embodiments, a light redirecting film 100 is disposed between adjacent spaced apart photovoltaic cells to reflect and redirect light that would otherwise pass between the photovoltaic cells. In some embodiments, the light redirecting film 100 includes a metal layer 400 that is disposed between polymeric layer 200 and 300 which can be electrically insulative so that the metal layer 400 is electrically insulated from the photovoltaic cells.

FIG. 10 is a schematic cross-sectional view of a photovoltaic assembly 1200 including spaced apart first (601) and second (602) photovoltaic cells and a light redirecting film 100 disposed on, and extending between, the first and second photovoltaic cells. The light redirecting film 100 can be disposed with the layer 200 facing the first and second photovoltaic cells 601 and 602 or with the layer 300 facing the photovoltaic cells 601 and 602. In some embodiments, the hot melt adhesive layer 200 bonds the light redirecting film 100 to the first and second photovoltaic cells 601 and 602.

EXAMPLES

Structured films were made by molding a molten first thermoplastic polyolefin resin. For these structured films, a cylindrically-shaped metal roll with finely detailed prismatic channels cut into its outer surface served as the mold. The thermoplastic polyolefin resin was made molten in an extruder. A standard film extrusion die was used to deliver the molten first resin onto the structured roll. Structure was imparted in the molten first resin by a rubber nip roll, pressed against the molten first resin and the structured roll. After cooling, the structured film was removed from the mold. Layer 300 of FIG. 1 (without the other layers of the figure) is representative of such a structured film. The structures had an included angle θ2 of about 120 degrees.

In order to enable ease of handling the structured film at the desired thickness, structured films were made where a second thermoplastic resin was coextruded with the molten first thermoplastic polyolefin resin using a die equipped with a multilayer feedblock. The two layers were coextruded such that the second thermoplastic resin contacted the rubber nip roll, the molten first thermoplastic polyolefin resin contacted the cylindrically-shaped metal roll with finely detailed prismatic channels. Layers 300 and 500 of FIG. 1 (without the other layers of the figure) is representative of such a two-layered structured film.

The second thermoplastic resin was selected to be incompatible with the first thermoplastic polyolefin resin such that the two layers may readily separate from each other when in film format. Two-layered structured films were made using TPX Grade DX310 4-methylpentene-1-based olefin copolymer (available from Mitsui Chemicals America, Inc., Rye Brook, N.Y., USA) as the first thermoplastic polyolefin resin and MAKROLON 2407 polycarbonate (available from Covestro North America, Pittsburgh, Pa., USA) as the second thermoplastic resin. Additional two-layered structured films were also made using HD6719 high density polyethylene copolymer (available from Exxon Mobil Chemical, Baytown, Tex., USA) as the first thermoplastic polyolefin resin and EASTAR GN071 copolyester (available from Eastman Chemical Company, Kingsport, Tenn., USA) as the second thermoplastic resin, and using HD6719 as the first thermoplastic polyolefin resin and MAKROLON 2407 as the second thermoplastic resin.

The structured surface of a TPX Grade DX310/MAKROLON 2407 film was treated using an oxygen plasma and then immediately (in the same vacuum chamber) coated with 60-100 nm of aluminum using a sputter coater.

The aluminum metal coated film was then coated with a hot melt adhesive by extruding the adhesive above its softening point and casting the hot melt against a chilled roll to yield an approximately 25 micrometer thick layer. The total thickness of the sample not including the second thermoplastic resin layer (layer 500) was about 50 micrometers. Samples were made using the following hot melt adhesives: ELVAX 3180 ethylene vinyl acetate (EVA) copolymer (available from Dow Chemical Company, Midland, Mich., USA), ELVAX 3175 ethylene vinyl acetate (EVA) copolymer (available from Dow Chemical Company), and ELVALOY 1224 which is copolymer of ethylene and methyl acrylate available from Dow Chemical Company.

A sample that was coated with ELVAX 3180 hot melt adhesive had prisms with an included angle of 120.2 degrees determined from a scanning electron microscope (SEM) image. The sample was laminated to a Cybrid 225 solar backsheet (available from Cybrid Technologies, Inc., Tucson, Ariz.) at a temperature of 145° C. and a pressure of 100 kPa for 13 minutes. According product data from the manufacturer, ELVAX 3180 has a melting point of 70° C. and a Vicat softening point of 43° C. Similar EVAs have a refractive index of about 1.48 to about 1.49. According to product date from the manufacturer, TPX Grade DX310 has a melting point of 223° C., a Vicat softening point of 147° C., and a refractive index (D-line wavelength) of 1.463. After lamination, the sample was cryo-microtomed and an optical microscope image of a cross-section was analyzed to determine the included angle after lamination. The result was an average of 118.4 degrees. The average included angle was about equal (believed to be within experimental error) to the original average included angle.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A light redirecting film comprising:
   a hot melt adhesive layer comprising a structured first major surface opposite a substantially planar second major surface, the structured first major surface comprising a plurality of substantially parallel microstructures extending along a first direction and arranged along an orthogonal second direction;
   a polymeric layer disposed on the hot melt adhesive layer and comprising a substantially planar third major surface opposite a structured fourth major surface, the structured first and fourth major surfaces facing each other; and
   an optically reflective layer disposed between, and conforming to, the structured first and fourth major surfaces, the hot melt adhesive layer, the polymeric layer and the optically reflective layer substantially co-extensive with each other, such that bonding the light redirecting film to a predetermined surface by applying the second major surface to the predetermined surface and raising a temperature of at least portions of the hot melt adhesive layer to at least a bonding temperature of the hot melt adhesive layer, changes an optical characteristic of the optically reflective layer by less than about 5%.

2. The light redirecting film of claim 1, wherein the bonding temperature is at least about 50° C.

3. The light redirecting film of claim 1, wherein the optically reflective layer is electrically conductive.

4. The light redirecting film of claim 1, wherein the optical characteristic of the optically reflective layer is an average surface roughness of the optically reflective layer or an average diffuse reflectance of the optically reflective layer.

5. The light redirecting film of any ono of claim 1, wherein each microstructure in the plurality of substantially parallel microstructures comprises opposing facets defining a first included angle therebetween, and wherein the optical characteristic of the optically reflective layer is the first included angle.

6. The light redirecting film of claim 1 further comprising a carrier layer disposed on and in contact with the substantially planar third major surface of the polymeric layer, such that a bonding strength between the hot melt adhesive layer and the optically reflective layer is greater than a bonding strength between the carrier layer and the polymeric layer.

7. The light redirecting film of claim 1 further comprising a release layer disposed on and in contact with the substantially planar third major surface of the polymeric layer, such that when the light redirecting film is bonded to the predetermined surface by applying the second major surface to the predetermined surface and raising the temperature of the at least portions of the hot melt adhesive layer to at least the bonding temperature of the hot melt adhesive layer, removing the release layer from the polymeric layer results in no, or very little, damage to the optically reflective layer.

8. A photovoltaic assembly comprising:
   at least one photovoltaic cell;
   at least one electrically conductive tabbing ribbon disposed on the at least one photovoltaic cell,
   wherein for each tabbing ribbon, a light redirecting film according to claim 1 is disposed on the tabbing ribbon such that the hot melt adhesive layer bonds the light redirecting film to the tabbing ribbon.

9. A light redirecting film comprising:
   a unitary hot melt adhesive layer comprising a structured first major surface opposite a substantially planar second major surface, the structured first major surface comprising a regular array of first structures, at least one of the first structures comprising opposing facets defining a first included angle therebetween;
   a unitary polymeric layer comprising a substantially planar third major surface opposite a structured fourth major surface facing, and substantially conforming to, the structured first major surface; and a metal layer disposed between, and substantially co-extensive with, the structured first and fourth major surfaces, the substantially planar second and third major surfaces less than about 55 micrometers spaced apart, such that raising a temperature of the light redirecting film to at least a bonding temperature of the hot melt adhesive while applying a pressure of at least about 1 atmosphere to the light redirecting film at least at a location on the light redirecting film corresponding to the at least one of the first structures, changes the first included angle by less than about 5%.

10. The light redirecting film of claim 9, wherein the first structures have an average height of less than about 20 micrometers.

11. The light redirecting film of claim 9, wherein the metal layer has an optical density of greater than about 1.5 for at least one wavelength in a range from about 350 nm to about 1100 nm.

12. The light redirecting film of claim 9, wherein the metal layer has an average thickness less than about 500 nm.

13. A light redirecting film comprising:

a first polymeric layer comprising a softening temperature T1 and a structured first major surface comprising a regular array of first structures, each first structure comprising a plurality of facets defining a first included angle therebetween, the first polymeric layer configured to bond to a predetermined surface at a bonding temperature greater than T1;

a second polymeric layer comprising a softening temperature T2, T2>T1, and a structured second major surface facing the structured first major surface and comprising a regular array of second structures, each second structure comprising a plurality of facets defining a second included angle therebetween, the structured first and second major surfaces defining a space therebetween; and a metal layer substantially filling the space between the structured first and second major surfaces, such that in a cross-section perpendicular to the light redirecting film, the first and second included angles have respective average values D1 and D2, and such that after heating the light redirecting film at a temperature between T1 and T2 for at least 10 minutes while applying a pressure of at least about 1 atmosphere to the light redirecting film, each of D1 and D2 changes by less than about 5%.

14. The light redirecting film of claim 13, wherein the softening temperature T1 is in a range from about 40° C. to about 120° C.

15. The light redirecting film of claim 13, wherein the first polymeric layer comprises one of more of a hot melt adhesive, a heat activated adhesive, a pressure sensitive adhesive, a structural adhesive, or an optically clear adhesive.

* * * * *

UNITED STATES PATENT AND TRADEMARK OFFICE
CERTIFICATE OF CORRECTION

| | |
|---|---|
| PATENT NO. | : 11,749,769 B2 |
| APPLICATION NO. | : 17/780342 |
| DATED | : September 5, 2023 |
| INVENTOR(S) | : Vivian W. Jones et al. |

It is certified that error appears in the above-identified patent and that said Letters Patent is hereby corrected as shown below:

In the Claims

Column 16
Line 29, In Claim 5, delete "The light redirecting film of any ono of claim 1," and insert -- The light redirecting film of claim 1, --, therefor.

Signed and Sealed this
Twenty-sixth Day of March, 2024

Katherine Kelly Vidal
Director of the United States Patent and Trademark Office